United States Patent
Barsukov et al.

(10) Patent No.: US 9,201,121 B2
(45) Date of Patent: Dec. 1, 2015

(54) SYSTEM AND METHOD FOR SENSING BATTERY CAPACITY

(75) Inventors: Yevgen Barsukov, Richardson, TX (US); Yandong Zhang, Plano, TX (US); Dale Allen Blackwell, Austin, TX (US)

(73) Assignee: Texas Instruments Incorporated, Dallas, TX (US)

(*) Notice: Subject to any disclaimer, the term of this patent is extended or adjusted under 35 U.S.C. 154(b) by 801 days.

(21) Appl. No.: 12/960,856

(22) Filed: Dec. 6, 2010

(65) Prior Publication Data

US 2012/0143585 A1   Jun. 7, 2012

(51) Int. Cl.
*G01R 31/36* (2006.01)

(52) U.S. Cl.
CPC .......... *G01R 31/3651* (2013.01); *G01R 31/362* (2013.01); *G01R 31/3662* (2013.01)

(58) Field of Classification Search
USPC ........................................................ 702/63
See application file for complete search history.

(56) References Cited

U.S. PATENT DOCUMENTS

| 6,094,033 | A   | 7/2000  | Ding et al.                |
|-----------|-----|---------|----------------------------|
| 6,789,026 | B2  | 9/2004  | Barsoukov et al.           |
| 6,832,171 | B2  | 12/2004 | Barsoukov et al.           |
| 6,892,148 | B2* | 5/2005  | Barsoukov et al. ..... 702/63 |
| 7,595,643 | B2  | 9/2009  | Klang                      |

FOREIGN PATENT DOCUMENTS

| JP | 2004311257    | 11/2004 |
| KR | 1020030013215 | 2/2003  |

OTHER PUBLICATIONS

PCT Search Report mailed Jul. 23, 2012.

* cited by examiner

*Primary Examiner* — Tung S Lau
(74) *Attorney, Agent, or Firm* — William B. Kempler; Frank D. Cimino

(57) ABSTRACT

One embodiment of the invention includes a battery sense system. The system includes a temperature sensor configured to measure a temperature of a battery and a memory configured to store predetermined data associated with steady-state and transient behaviors of the battery relative to a depth of discharge (DOD) of the battery. The system also includes a controller configured to measure a voltage of the battery and to calculate a state of charge (SOC) of the battery based on the voltage, the predetermined data, and the temperature.

5 Claims, 3 Drawing Sheets

SYSTEM AND METHOD FOR SENSING BATTERY CAPACITY

TECHNICAL FIELD

The invention relates generally to electronic circuits and, more specifically, to a system and method for sensing battery capacity.

BACKGROUND

Portable electronic devices are powered by batteries that generate a voltage based on chemical reactions. As a battery provides power to the portable electronic device, the capacity of the battery to provide the power becomes diminished. Some portable electronic devices provide indications of remaining battery capacity, such that the user of the portable electronic device is provided with notice of the remaining battery capacity. However, such battery sense systems can often be inaccurate and/or can include additional circuit components that can be expensive, bulky, and/or inefficient with respect to power draw.

SUMMARY

One embodiment of the invention includes a battery sense system. The system includes a temperature sensor configured to measure a temperature of a battery and a memory configured to store predetermined data associated with steady-state and transient behaviors of the battery relative to a depth of discharge (DOD) of the battery. The system also includes a controller configured to measure a voltage of the battery and to calculate a state of charge (SOC) of the battery based on the voltage, the predetermined data, and the temperature.

Another embodiment of the invention method for calculating an SOC of a battery. The method includes modeling the battery as a dynamic battery model comprising a steady-state circuit portion and a transient circuit portion to determine predetermined data associated with steady-state and transient behaviors of the battery relative to a DOD of the battery. The method also includes determining a temperature of the battery, measuring a voltage of the battery, and accessing the predetermined data from a memory. The method further includes calculating the SOC of the battery based on the voltage, the predetermined data, and the temperature.

Yet another embodiment of the invention includes a battery sense system. The system includes a temperature sensor configured to measure a temperature of a battery and a memory configured to store predetermined data associated with steady-state and transient behaviors of the battery relative to a DOD of the battery. The system also includes a controller configured to obtain samples of a voltage of the battery at each of a plurality of sampling intervals, to estimate a corresponding current generated by the battery at a given sampling interval based on the voltage at a respective one of the sampling intervals, the predetermined data, and the temperature. The controller is also configured to calculate an SOC of the battery based on based on the current through the battery at the respective one of the sampling intervals and based on the DOD of the battery at an immediately preceding sampling interval.

DETAILED DESCRIPTION

Figure 1:
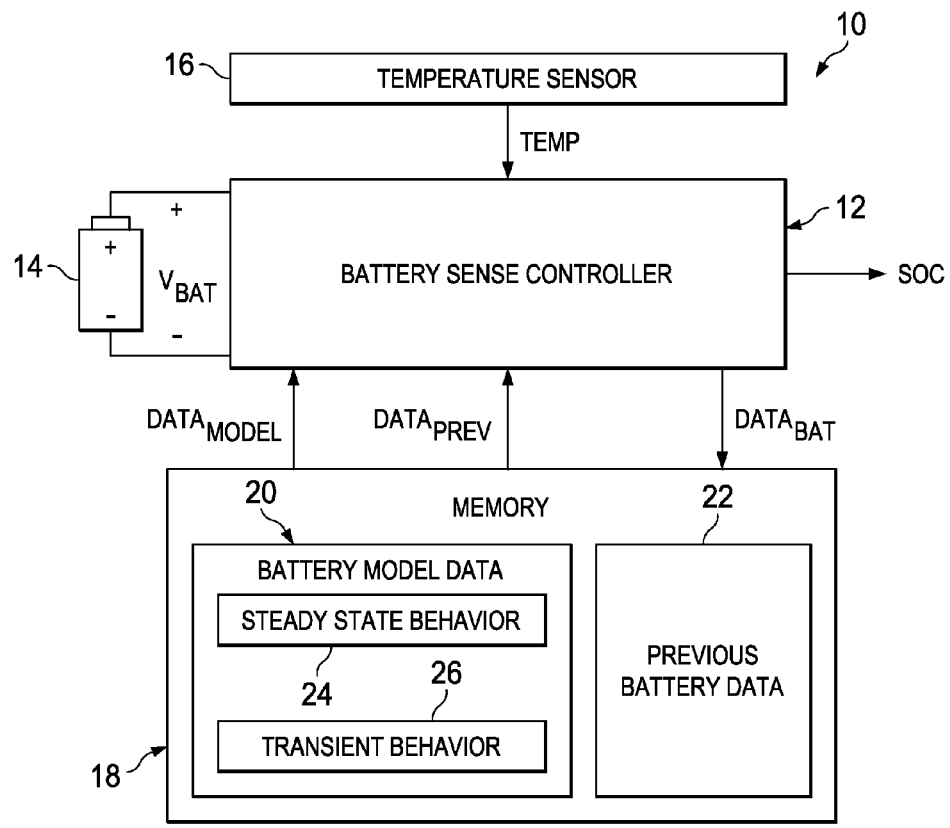
FIG. 1 illustrates an example of a battery sense system in accordance with an aspect of the invention.

The invention relates generally to electronic circuits and, more specifically, to a system and method for sensing battery capacity. A battery sense system can include a temperature sensor that measures a temperature of the battery. The temperature is provided to a battery sense controller that is configured to measure a voltage of the battery and to calculate a state of charge (SOC) of the battery based on the voltage, the temperature, and based on predetermined data associated with steady-state and transient behavior of the battery. The predetermined data can be stored in a memory, which can be accessed by the battery sense controller at each of a plurality of sampling intervals, such that the SOC of the battery can likewise be determined at each of the sampling intervals.

As described herein, the SOC of a battery is sometimes used to indicate how much available charge remains in the battery. The depth of discharge (DOD) of the battery can refer to how much the battery has discharged, and can be defined as a present remaining integrated charge Q divided by a maximum total zero-current charge $Q_{MAX}$ of the battery. The DOD of the battery is related to the SOC by the equation DOD+SOC=1, and is usually utilized to obtain a computation of the remaining run-time of a device powered by the battery. Therefore, as described herein, the SOC and DOD can generally be described in an interchangeable manner based on the inversely proportional relationship between SOC and DOD with respect to one.

The predetermined data can be generated offline and can correspond to the particular battery chemistry of the battery being sensed, such as at a time prior to manufacture of the battery, based on modeling the battery as a dynamic battery model and performing a series of tests on a corresponding test battery. As an example, the dynamic battery model can be configured to include a steady-state circuit portion and a transient circuit portion that each includes at least one RC network. For example, an RC network of the steady-state circuit portion can include a series-connected resistor and capacitor, and an RC network of the transient circuit portion can include a parallel-connected resistor and capacitor. The values of the resistors and capacitors in each of the respective static and transient circuit portions can be determined by applying a predetermined load to the corresponding test battery, determining a change in voltage relative to a responsive current, and removing the load to determine a voltage response. Furthermore, the values of resistance of the battery and the voltage of the steady-state circuit portion of the dynamic battery model can be temperature dependent, and can thus likewise be determined on the test battery and included in the predetermined data.

The battery sense controller can thus perform a series of calculations based on the voltage, the predetermined data, and the temperature of the battery to determine the SOC of the battery. Specifically, the battery sense controller can iteratively calculate a current of the battery at each of a plurality of sampling intervals based on the voltage at the respective sampling intervals and the DOD of the previous sampling period. The current can then be used to calculate a current SOC of the battery. Accordingly, the battery sense controller can continue to calculate new values for the SOC of the battery based on prior calculations and current measurements of both voltage and temperature.

FIG. 1 illustrates an example of a battery sense system 10 in accordance with an aspect of the invention. The battery sense system 10 can be included as part of any of a variety of portable electronic devices, such as a laptop computer, a camera, or a wireless communications device. The battery sense system 10 a battery sense controller 12 that is configured to determine a state of charge (SOC) of a battery 14 during operation of the associated portable electronic device. Specifically, the battery sense controller 12 can be configured to continuously sample a voltage $V_{BAT}$ of the battery 14 at each of a plurality of sampling periods to provide the SOC of the battery 14 at each of the sampling periods based on the voltage $V_{BAT}$, a temperature of the battery 14, predetermined data associated with steady-state and transient behaviors of the battery 14 relative to a depth of discharge (DOD) of the battery 14. In the example of FIG. 1, the battery 14 is demonstrated as a single battery. However, it is to be understood that the battery 14 can represent a plurality of batteries electrically connected in series, such that the voltage $V_{BAT}$ could represent an aggregate voltage of all of the batteries. Therefore, the SOC calculated by the battery sense controller 12 can be an average SOC of the plurality of batteries.

The battery sense system 10 includes a temperature sensor 16 that is configured to provide a temperature signal TEMP to the battery sense controller 12. The temperature signal TEMP can be a signal associated with an actual temperature of the battery 14, such as based on an external sensor coupled directly to the battery 14, or can be a measure of an ambient temperature of an area surrounding the battery. As an example, the temperature signal TEMP can be a digital signal, such as provided by an analog-to-digital converter (ADC) that can be part of the temperature sensor 16. The battery sense system 10 also includes a memory 18 that is configured to store battery model data 20 and previous battery data 22. The battery model data 20 includes steady-state behavior data 24 corresponding to steady-state behavior parameters of the battery 14 and transient behavior data 26 corresponding to transient behavior parameters of the battery 14. As described in greater detail below, the steady-state behavior data 24 and the transient behavior data 26 can include data regarding a dynamic battery model having values that are dependent on the DOD of the battery 14.

The battery model data 20 can be generated offline, such as at a time prior to manufacture of the battery 14, by conducting tests on a test battery (not shown) having substantially the same chemistry as the battery 14. The characteristics of a given battery, as dependent on DOD, are generally applicable to all batteries having a particular chemistry. For example, a comparison of an open circuit voltage $V_{OC}$ of a given battery relative to a DOD for four different batteries, each having the same chemistry, from four different manufacturers shows that the open circuit voltages $V_{OC}$ of each of the batteries do not differ by more than approximately 5 millivolts, so the same database can be used for all batteries of the same chemistry (e.g., lithium ion). Thus, the battery model data 20 can correspond to data associated with a battery of substantially the same chemistry as the battery 14, such that the battery model data 20 can be implemented to provide an accurate calculation of the SOC of the battery 14. Accordingly, the battery sense controller 12 can implement the battery model data 20, provided from the memory 18 via a signal $DATA_{MODEL}$, to calculate the SOC of the battery 14.

The previous battery data 22 is a set of data corresponding to prior calculations of data regarding the battery 14. As an example, the previous battery data 22 can include a previously calculated DOD of the battery 14, a previously measured voltage $V_{BAT}$, and a previously estimated battery current. In the example of FIG. 1, upon the battery sense controller 12 calculating the DOD of the battery 14, the battery sense controller 12 can provide the DOD and additional data required for the calculation to the memory 18 as a signal $DATA_{BAT}$ to be stored as the previous battery data 22. Thus, upon the battery sense controller 12 calculating a next DOD value of the battery 14, the battery sense controller 12 can receive the previous battery data 22 via a signal $DATA_{PREV}$, provided from the memory 18, to implement the previous battery data 20 to calculate the SOC of the battery 14. Accordingly, as described in greater detail below, the battery sense controller 12 can calculate a current SOC of the battery 14 based on the voltage $V_{BAT}$, the temperature of the battery 14, indicated by the temperature signal TEMP, the battery model data 20, indicated by the signal $DATA_{BAT}$, and the previous battery data 22, indicated by the signal $DATA_{PREV}$.

Figure 2:
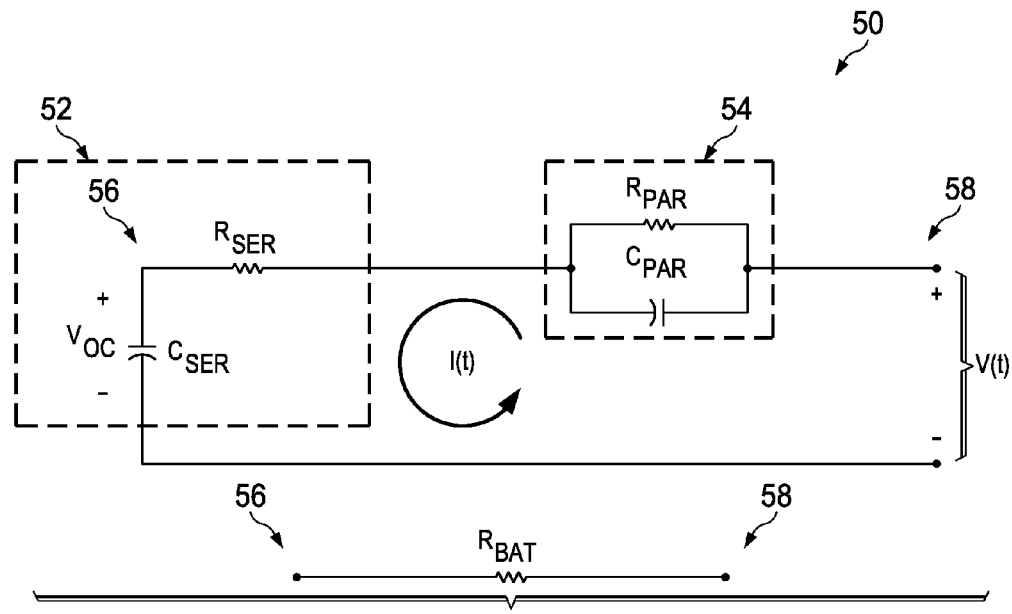
FIG. 2 illustrates an example of a dynamic battery model in accordance with an aspect of the invention.

As described above, the battery model data 20 can be generated for the battery 14 based on modeling the battery 14 as a dynamic battery model. FIG. 2 illustrates an example of a dynamic battery model 50 in accordance with an aspect of the invention. The dynamic battery model 50 can correspond to the battery 14 in the example of FIG. 1. Therefore, reference is to be made to the example of FIG. 1 in the following description of the example of FIG. 2.

The dynamic battery model 50 includes a steady-state circuit portion 52 and a transient circuit portion 54 that are each configured as RC networks. Specifically, the steady-state circuit portion 52 includes a resistor $R_{SER}$ and a capacitor $C_{SER}$ that are arranged in series and the transient circuit portion 54 includes a resistor $R_{PAR}$ and a capacitor $C_{PAR}$ that are arranged in parallel. While the example of FIG. 2 demonstrates a single parallel-coupled RC network for the transient circuit portion 54, it is to be understood that the transient circuit portion 54 can include multiple parallel-coupled RC networks, such as connected in series with each other, that collectively model the transient characteristics of the battery 14. The capacitor $C_{SER}$ corresponds to a voltage source of the dynamic battery model, and is thus modeled as having an associated open-circuit voltage $V_{OC}$ across it. The open-circuit voltage $V_{OC}$ thus corresponds to an instantaneous steady-state voltage of the dynamic battery model 50. Collectively, the resistor $R_{SER}$ and the transient circuit portion 54 constitute a battery impedance between nodes 56 and 58 for the dynamic battery model 50 having a resistance $R_{BAT}$. The dynamic battery model 50 also has a sample voltage V(t) and an associated sample current I(t) corresponding to instantaneous magnitudes of the voltage and current of the dynamic battery model 50 at a given sample time.

The dynamic battery model 50 can be used to build a table of predetermined data associated with steady-state and transient behaviors of the battery 14, such as included in the battery model data 20 in the example of FIG. 1. As an example, during testing for the particular chemistry of the battery 14, a predetermined load (not shown) can be periodically coupled and decoupled to the corresponding test battery to measure a voltage response of the test battery through the life of the test battery. Therefore, operational characteristics of the battery 14 can be obtained at predetermined DOD values of the battery 14. Thus, the operational characteristics of the battery 14 during the test can be implemented to determine values for the open-circuit voltage $V_{OC}$, the capacitance $C_{SER}$, the resistance $R_{SER}$, the capacitance $C_{PAR}$, and the resistance $R_{PAR}$ at each of the predetermined DOD values of the battery 14. Such values can then be used to build the battery model data 20 as a function of DOD of the battery 14.

Figure 3:
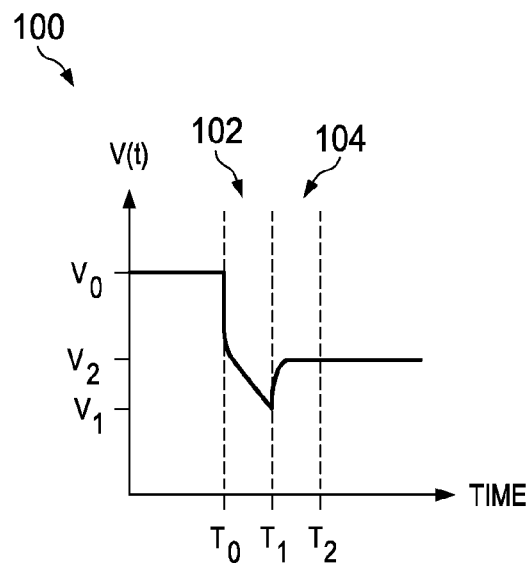
FIG. 3 illustrates an example of a graph of voltage versus time in accordance with an aspect of the invention.

FIG. 3 illustrates an example of a graph 100 of voltage versus time in accordance with an aspect of the invention. The graph 100 can describe a voltage response of the test battery that is associated with the dynamic battery model 50 in the example of FIG. 2, and thus can be implemented to ascertain values for the open-circuit voltage $V_{OC}$, the capacitance $C_{SER}$, the resistance $R_{SER}$, the capacitance $C_{PAR}$, and the resistance $R_{PAR}$ at each of the predetermined DOD values of the battery 14. Thus, reference is to be made to the example of FIGS. 1 and 2 in the following example of FIG. 3.

The graph 100 demonstrates the voltage $V(t)$ of the dynamic battery model 50 plotted as a function of time. In performing tests on the test battery, a predetermined load can be applied to and removed from the test battery at specific DOD intervals of the test battery. The voltage response of the test battery can thus be monitored to ascertain the values for the open-circuit voltage $V_{OC}$, the capacitance $C_{SER}$, the resistance $R_{SER}$, the capacitance $C_{PAR}$, and the resistance $R_{PAR}$ at each of the DOD intervals. Specifically, at a time $T_0$, there is no load applied to the test battery, such that the voltage $V(t)$ has a value $V_0$ that remains substantially constant.

Subsequent to the time $T_0$, at a time $T_1$, the predetermined load is applied to the test battery, such that a known current $I(t)$ flows from the test battery. In response, the voltage $V(t)$ begins to reduce from the magnitude $V_0$ at the time $T_1$ to a magnitude $V_1$ at a time $T_2$, at which time the predetermined load is removed from the test battery. The region of time between the times $T_1$ and $T_2$ of the graph 100 can thus define a high-frequency region 102 of the voltage $V(t)$, which can thus identify parameters of the test battery during a given DOD interval X of the high-frequency region 102. As an example, the value of the resistor $R_{SER}$ can be identified based on a change in the voltage $V(t)$ relative to the change in current $I(t)$, such that:

$$R_{SER}(X) = dV(t)/dI(t) \qquad \text{Equation 1}$$

Thus, the value of the resistor $R_{PAR}$ can be ascertained as follows:

$$R_{PAR}(X) = R_{BAT}(X) - R_{SER}(X) \qquad \text{Equation 2}$$

In addition, for a given DOD interval, the open circuit voltage $V_{OC}$ across the capacitor $C_{SER}$ can be determined based on the voltage $V(t)$ and the as follows:

$$V_{OC}(X) = V(t) - V_{RC}(X) = I(t) * R_{BAT}(X) \qquad \text{Equation 3}$$

Where: $V_{RC}$ is the voltage across the resistance $R_{BAT}$.
Therefore, the high-frequency region 102 of a given DOD interval can be implemented to determine the values of $R_{SER}$, $R_{PAR}$, and $V_{OC}$ for the given DOD interval X.

After the time $T_2$, upon the predetermined load being removed from the test battery, the voltage $V(t)$ relaxes, and thus increases from the magnitude of $V_1$ to a magnitude of $V_2$ in the example of FIG. 3. Thus, the time $T_2$ defines a relaxation region 104. The increase in the magnitude of the voltage $V(t)$ from $V_1$ to $V_2$ in the relaxation region 104 can thus be analyzed to determine an additional parameter of the dynamic battery model 50. Specifically, the increase in the voltage $V(t)$ as a function of time t can determine the magnitude of the capacitance $C_{PAR}$ for the DOD interval X, as follows:

$$C_{PAR}(X) = dV(t)/dt \qquad \text{Equation 4}$$

Upon ascertaining the values for the open-circuit voltage $V_{OC}$, the resistance $R_{SER}$, the capacitance $C_{PAR}$, and the resistance $R_{PAR}$ at each of the DOD intervals, the values for the capacitance $C_{SER}$ can be determined based on the number Y of DOD intervals for which the test battery was tested. Specifically, for the DOD interval X, the values for the capacitance $C_{SER}$ can be determined as follows:

$$C_{SER}(X) = \frac{Q_{MAX}}{(Y-1)} * (V_{OC}(X) - V_{OC}(X-1)) \qquad \text{Equation 5}$$

Where: $Q_{MAX}$ is a maximum total zero-current charge of the test battery.
Therefore, the circuit parameters of the dynamic battery model 50 can be fully modeled for each of the DOD intervals Y.

The initial experimentation to ascertain values for the open-circuit voltage $V_{OC}$, the capacitance $C_{SER}$, the resistance $R_{SER}$, the capacitance $C_{PAR}$, and the resistance $R_{PAR}$ at each of the predetermined DOD values of the battery 14 can be conducted at a predetermined "room" temperature. Thus, based on the temperature dependence of both the resistance and the voltage of the dynamic battery model 50, the experimentation using the test battery in building the battery model data 20 based on the dynamic battery model 50 can also incorporate temperature components. Specifically, as temperature will affect the resistors $R_{SER}$ and $R_{BAT}$ and the capacitors $C_{SER}$ and $C_{PAR}$ substantially equally, ratios of the magnitudes of the resistors $R_{SER}$ and $R_{BAT}$ and the capacitors $C_{SER}$ and $C_{PAR}$ can be developed and incorporated as part of the battery model data 20. Specifically, the ratios at each DOD interval X can be defined as follows:

$$\text{RATIO}_1(X) = R_{SER}(X)/R_{PAR}(X) \qquad \text{Equation 6}$$

$$\text{RATIO}_2(X) = C_{SER}(X)/C_{PAR}(X) \qquad \text{Equation 7}$$

In addition, based on temperature experimentation on the test battery, a set of factors for calculating the open-circuit voltage $V_{OC}$ and the battery resistance $R_{BAT}$ based on temperature can be determined. Specifically, the set of DOD dependent variables can allow temperature dependent calculation of the open-circuit voltage $V_{OC}$ and the battery resistance $R_{BAT}$ based on the following equations:

$$V_{OC}(X) = \text{OCV\_}A(X) + \text{OCV\_}B(X) * T \qquad \text{Equation 8}$$

$$R_{BAT}(X) = R\_A(X)^{(R\_(X)*(10*T-250))} \qquad \text{Equation 9}$$

Where: T is temperature;
OCV_A is an intercept variable for the open-circuit voltage $V_{OC}$;
OCV_B is a slope coefficient for the open-circuit voltage $V_{OC}$;
R_A is a base variable for the battery resistance $R_{BAT}$; and
R_B is an exponent coefficient for the battery resistance $R_{BAT}$.

Thus, the battery model data 20 can include values for the intercept variable OCV_A, the slope coefficient OCV_B, the base variable R_A, and the exponent coefficient R_B for each of the Y DOD values. The base variable R_A may have dynamic values, such that the battery sense controller 12 can update the values of the base variable R_A (e.g., via the signal $\text{DATA}_{BAT}$) to account for battery aging, such as based on a comparison of information associated with the measured voltage $V_{BAT}$, the open-circuit voltage $V_{OC}$, and an estimated current $I_{EST}$ (described in greater detail below). Additionally, based on the differing effects of temperature on the resistance, the exponent coefficient R_B could include a plurality of values at each of the DOD values based on different ranges of temperature. As an example, at a given DOD value X, the battery model data 20 could include an exponent coefficient R_B$_{LOW}$ for temperatures below a certain threshold (e.g., 25° C.) and a separate exponent coefficient R_B$_{HIGH}$ for temperatures above the threshold.

Figure 4:
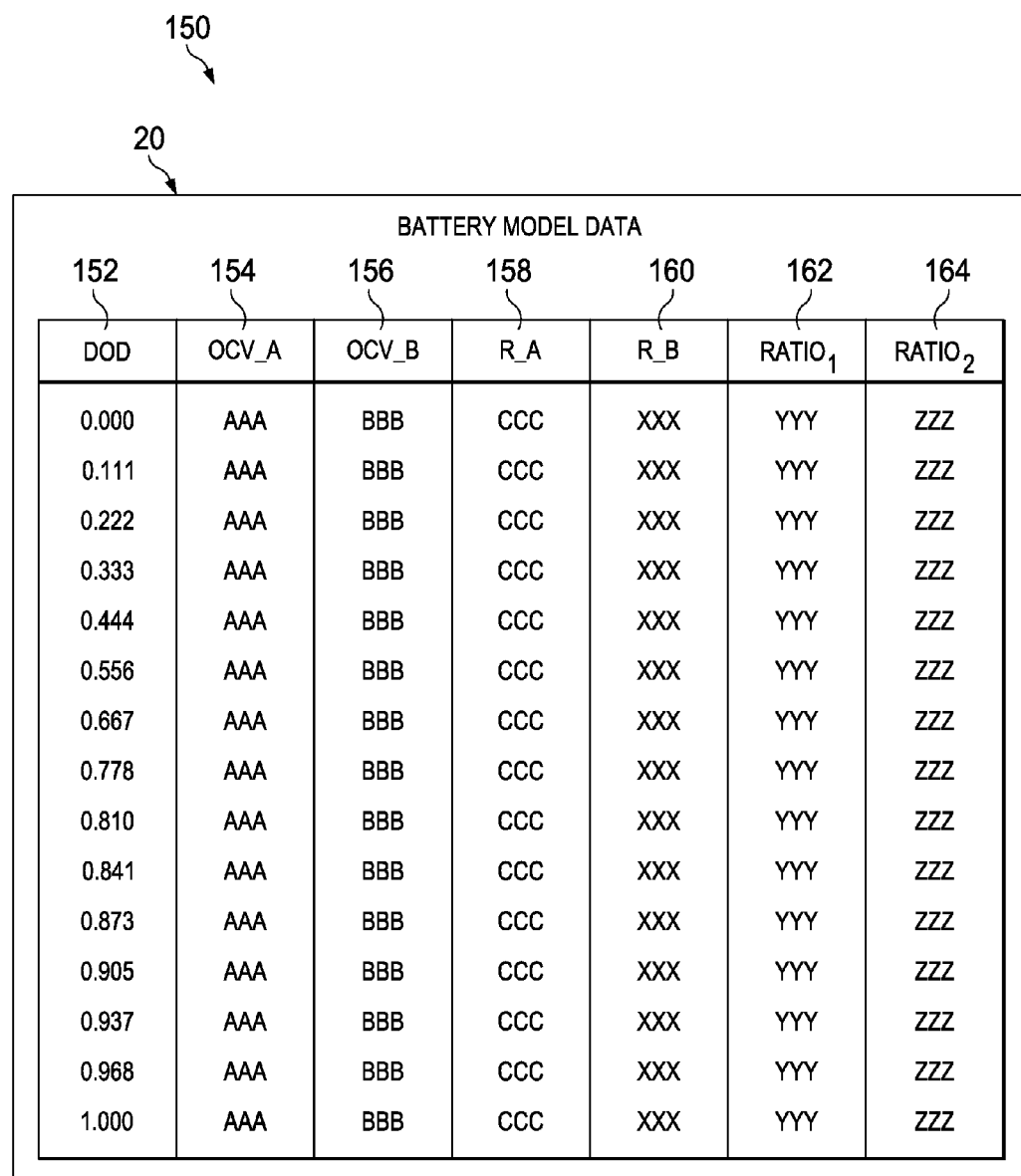
FIG. 4 illustrates an example of a table of dynamic battery model data in accordance with an aspect of the invention.

FIG. 4 illustrates an example of a table 150 of the dynamic battery model data in accordance with an aspect of the invention. The dynamic battery model data can correspond to the battery model data 20 in the example of FIG. 1, and can be generated based on the techniques described above with respect to the examples of FIGS. 2 and 3. Therefore, reference is to be made to the examples of FIGS. 1 through 3 in the following examples of FIG. 4.

The table 150 includes a first column 152 that demonstrates a set of DOD values for which a given set of the battery model data 20 is ascertained from the test battery and the dynamic battery model 50. In the example of FIG. 4, the first column 152 includes 15 different values for the DOD of the battery 14. However, it is to be understood that the values of the DOD in the example of FIG. 4 are demonstrated as an example, and that the table 150 could include any number of DOD values for which the battery model data 20 has been obtained. The table 150 also includes a second column 154 that demonstrates the intercept variable OCV_A, a third column 156 that demonstrates the slope coefficient OCV_B, and a fourth column 158 that demonstrates the base variable R_A. The table 150 also includes a fifth column 160 that demonstrates the exponent coefficient R_B, a sixth column 162 demonstrating the RATIO$_1$, and a seventh column that demonstrates the RATIO$_2$. Therefore, the battery model data 20 can include a substantially complete characterization of the steady-state and transient behaviors of the battery 14 for determining the SOC of the battery 14.

Referring back to the example of FIG. 1, at a given sampling time (k), the battery sense controller 12 can thus calculate the SOC of the battery 14. The battery sense controller 12 can first measure the voltage V$_{BAT}$(k) and the temperature T of the battery 14 via the temperature signal TEMP and can estimate a current I$_{EST}$(k) of the battery 14. To estimate the current I$_{EST}$(k), the battery sense controller 12 can access the memory 18 for the previous battery data 22, via the signal DATA$_{PREV}$, to obtain the DOD, the estimated current I$_{EST}$, and the battery voltage V$_{BAT}$ that were obtained and calculated at a previous sampling time (k−1). Based on the value of the DOD(k−1), the battery sense controller 12 can access the memory 18 to obtain the battery model data 20 via the signal DATA$_{MODEL}$. Specifically, the battery sense controller 12 can access the parameters from the table 150 corresponding to the two known DOD values that are immediately greater than and immediately less than the DOD(k−1). Therefore, the battery sense controller 12 can determine values for the intercept variable OCV_A, the slope coefficient OCV_B, the base variable R_A, the exponent coefficient R_B, the RATIO$_1$, and the RATIO$_2$ based on linear interpolation of the values at each of DOD(X) and DOD(X+1) between which DOD(k−1) resides. It is to be understood that, for the first sampling time (k) after a fully charged battery 14 (i.e., SOC=1), the data of the previous sampling time (k−1) can correspond to the battery model data 20 of the first value of the DOD (i.e., DOD=0.000).

Upon obtaining the values for the battery model data 20 at the DOD(k−1), the battery sense controller 12 can implement Equations 6 and 9 above to obtain actual values for the modeled resistance R$_{SER}$ and R$_{PAR}$ of the battery 14 based on the temperature T. Specifically, using Equation 9, the battery sense controller 12 can calculate the total resistance of the battery R$_{BAT}$ as adjusted for temperature. Then, using the temperature adjusted resistance value of the battery R$_{BAT}$, the battery sense controller 12 can implement Equation 6 as follows:

$$R_{BAT}=R_{SER}+R_{PAR}=R_{PAR}+R_{PAR}*\text{RATIO}_1 \quad \text{Equation 10}$$

Therefore, the battery sense controller 12 can calculate the modeled resistance R$_{SER}$ and R$_{PAR}$ of the battery 14 as follows:

$$R_{PAR}=R_{BAT}/(1+\text{RATIO}_1) \quad \text{Equation 11}$$

$$R_{SER}=R_{BAT}-R_{PAR} \quad \text{Equation 12}$$

As described above, the battery sense controller 12 can obtain values for the open-circuit voltage V$_{OC}$ and the capacitance C$_{SER}$ for every one of the DOD values X based on Equations 3 and 5, respectively. Thus, the battery sense controller 12 can likewise determine the values of the open-circuit voltage V$_{OC}$ and the capacitance C$_{SER}$ based on linear interpolation of the values at each of DOD(X) and DOD(X+1) between which DOD(k−1) resides. The battery sense controller 12 can then calculate the value of the capacitance C$_{PAR}$ as follows:

$$C_{PAR}=C_{SER}/\text{RATIO}_2 \quad \text{Equation 13}$$

The battery sense controller 12 can then use the values calculated for the resistances R$_{SER}$ and R$_{PAR}$, the capacitance C$_{PAR}$, and the open-circuit voltage V$_{OC}$ to estimate the current I$_{EST}$(k). Specifically, the battery sense controller 12 can use the values calculated for the resistances R$_{SER}$ and R$_{PAR}$ and the capacitance C$_{PAR}$ to calculate a set of coefficients for estimating the current I$_{EST}$(k). The coefficients can be defined as follows:

$$P_0 = 1/R_{SER} \quad \text{Equation 14}$$

$$P_1 = -e^{\frac{-Ts}{(R_{PAR}*C_{PAR})}} \quad \text{Equation 15}$$

$$P_2 = e^{\frac{-Ts}{(R_{PAR}*R_{SER})}} - R_{PAR} * \frac{\left(1-e^{\frac{-Ts}{(R_{PAR}*C_{PAR})}}\right)}{R_{SER}} \quad \text{Equation 16}$$

Where: Ts is a sampling time.

It is to be understood that the coefficients P$_0$, P$_1$, and P$_2$ can be calculated at each sample (k), as described above, or could be calculated during testing at each predetermined DOD(X), such that the values of the coefficients P$_0$, P$_1$, and P$_2$ at a given sampling time (k) can be linearly interpolated, similar to as described above.

The battery sense controller 12 can then calculate the voltage V$_{RC}$ across the resistor R$_{SER}$ and the transient circuit portion 54 based on the open-circuit voltage V$_{OC}$ for the given sample (k), as follows:

$$V_{RC}(k)=V_{BAT}(k)-V_{OC}(k) \quad \text{Equation 17}$$

To obtain the open-circuit voltage V$_{OC}$(k), the battery sense controller can implement the values of the previously calculated open-circuit voltage V$_{OC}$(k−1) and the previously estimated current I$_{EST}$(k−1), stored in the previous battery data 22, as follows:

$$V_{OC}(k)=I_{EST}(k-1)*Ts*C_{SER}(k)+V_{OC}(k-1) \quad \text{Equation 18}$$

The open-circuit voltage V$_{OC}$(k) can also be adjusted for temperature using Equation 8 described above. Therefore, the battery sense controller 12 can estimate the current I$_{EST}$(k) generated by the battery 14 as follows:

$$I_{EST}(k)=P_0*V_{RC}(k)+P_1*V_{RC}(k-1)+P_2*I_{EST}(k-1) \quad \text{Equation 19}$$

Upon estimating the current $I_{EST}(k)$ generated by the battery 14, the battery sense controller 12 can also calculate the SOC of the battery 14 at the sample time (k). Specifically, the battery sense controller 12 can implement the previous value of the DOD(k−1) and the previously estimated current $I_{EST}(k-1)$, as follows:

$$DOD(k)=DOD(k-1)-I_{EST}(k-1)*Ts/Q_{MAX} \qquad \text{Equation 20}$$

$$SOC(k)=1-DOD(k) \qquad \text{Equation 21}$$

The SOC(k) can then be provided to an indicator (not shown) that provides an indication of the SOC of the battery 14 to a user of the associated portable electronic device. The values of the DOD(k), the open-circuit voltage $V_{OC}(k)$, and the estimated current $I_{EST}(k)$ can then be provided to the memory 18 via the signal $DATA_{BAT}$ to be stored as the previous battery data 22, such that the battery sense controller 12 can recursively calculate the SOC of the battery at a future sampling time (k+1). In addition, the resistance base variable R_A can be updated in the memory 18 to account for changes in the battery resistance $R_{BAT}$ as the battery 14 ages.

Therefore, the SOC of the battery 14 can be accurately calculated based on the voltage $V_{BAT}$ and the temperature T of the battery 14. Such a manner of battery sensing is thus more accurate than a typical voltage correlation battery sensing method because the battery sensing described herein accounts for an IR drop effect on the voltage $V_{BAT}$ while current flows through the load. In addition, the manner of battery sensing described herein is also more cost effective and efficient than a typical coulomb counting battery sensing method because the battery sensing described herein does not require an additional current sensor to calculate the SOC of the battery 14. Accordingly, the battery sensing methodology described herein is more accurate, cost effective, and efficient than typical battery sensing methodologies.

Figure 5:
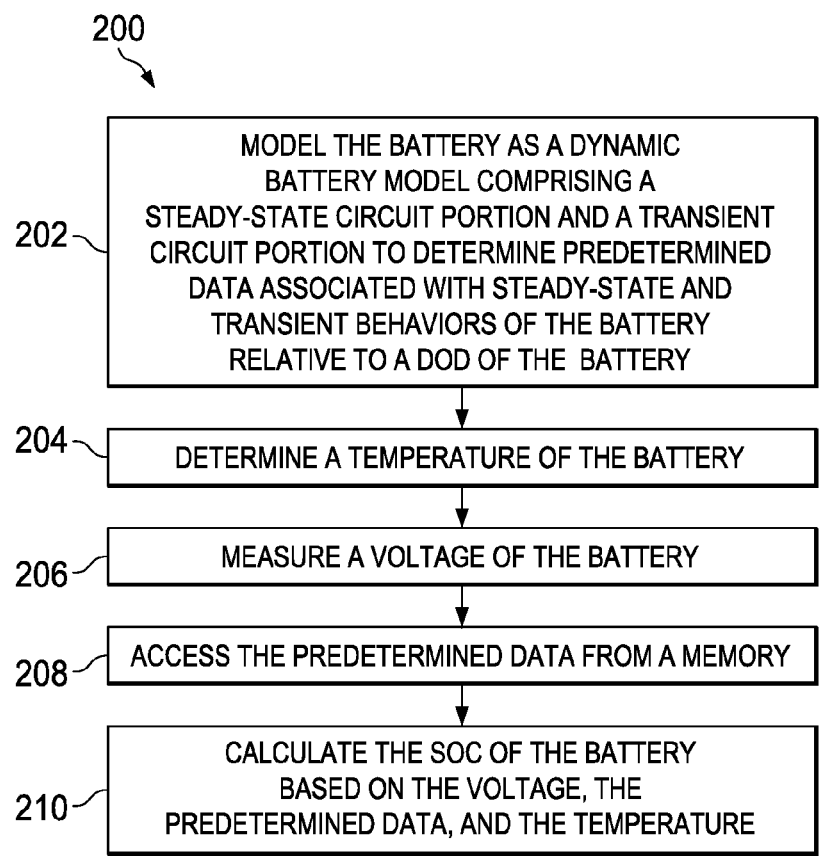
FIG. 5 illustrates an example of a method for calculating a state of charge (SOC) of a battery in accordance with an aspect of the invention.

In view of the foregoing structural and functional features described above, a methodology in accordance with various aspects of the invention will be better appreciated with reference to FIG. 5. While, for purposes of simplicity of explanation, the methodology of FIG. 5 is shown and described as executing serially, it is to be understood and appreciated that the invention is not limited by the illustrated order, as some aspects could, in accordance with the invention, occur in different orders and/or concurrently with other aspects from that shown and described herein. Moreover, not all illustrated features may be required to implement a methodology in accordance with an aspect of the invention.

FIG. 5 illustrates an example of a method 200 for calculating a state of charge (SOC) of a battery in accordance with an aspect of the invention. At 202, the battery is modeled as a dynamic battery model comprising a steady-state circuit portion and a transient circuit portion to determine predetermined data associated with steady-state and transient behaviors of the battery relative to a DOD of the battery. The modeling of the battery can include determining values for resistors and capacitors, as well as temperature dependent variables associated with voltage and resistance of the battery, for each of a predetermined number of DOD values of the dynamic battery model. The dynamic battery model and associated test battery can have the same chemistry as the battery for accurate modeling of the circuit parameters.

At 204, a temperature of the battery is determined. The temperature can be determined based on a temperature sensor that monitors the temperature of the battery or an ambient temperature of the battery environment. At 206, a voltage of the battery is measured. At 208, the predetermined data is accessed from a memory. The predetermined data can also include previously calculated battery data, including a previously calculated DOD and estimated current. At 210, the SOC of the battery is calculated based on the voltage, the predetermined data, and the temperature. The calculation of the SOC can be based on the Equations described above.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A battery sense system comprising:
a temperature sensor configured to measure a temperature of a battery;
a memory configured to store predetermined data associated with steady-state and transient behaviors of the battery relative to a depth of discharge (DOD) of the battery; and
a controller configured to obtain samples of a voltage of the battery at each of a plurality of sampling intervals, to estimate, without requiring an additional current sensor, a corresponding current generated by the battery at a given sampling interval k of the plurality of sample intervals wherein battery current can be determined both under operating conditions and passive conditions based only on the voltage at a respective one of the sampling intervals, the predetermined data, and the temperature, and to calculate a state of charge (SOC) of the battery based on based on the estimated current through the battery at the respective one of the sampling intervals and based on the DOD of the battery at an immediately preceding sampling interval k-1.

2. The system of claim 1, wherein the predetermined data associated with the steady-state and transient behaviors of the battery are determined based on modeling the battery as a dynamic battery model comprising a steady-state circuit portion and a transient circuit portion, each of the static and transient circuit portions comprising at least one RC network.

3. The system of claim 1 wherein the estimate of the battery current at the present sample is based on a plurality of previous voltage samples.

4. The system of claim 2, wherein at least a portion of the predetermined data associated with the steady-state and transient behaviors of the battery is determined based on applying a predetermined load to the dynamic battery model and measuring a change in a voltage associated with the dynamic battery model as a function of a current through the predetermined load.

5. The system of claim 4, wherein at least a portion of the predetermined data associated with the steady-state and transient behaviors of the battery is determined based on measuring a voltage response associated with the dynamic battery model upon removing the predetermined load.

* * * * *